(12) United States Patent
Peng et al.

(10) Patent No.: US 11,315,610 B1
(45) Date of Patent: Apr. 26, 2022

(54) SENSE AMPLIFIER, MEMORY AND METHOD FOR CONTROLLING SENSE AMPLIFIER

(71) Applicants: ANHUI UNIVERSITY, Anhui (CN); CHANGXIN MEMORY TECHNOLOGIES, INC., Hefei (CN)

(72) Inventors: Chunyu Peng, Hefei (CN); Zijian Wang, Hefei (CN); Wenjuan Lu, Hefei (CN); Xiulong Wu, Hefei (CN); Jun He, Hefei (CN); Xin Li, Hefei (CN); Zhan Ying, Hefei (CN); Kanyu Cao, Hefei (CN); Zhiting Lin, Hefei (CN); Junning Chen, Hefei (CN)

(73) Assignees: CHANGXIN MEMORY TECHNOLOGIES, INC., Anhui (CN); ANHUI UNIVERSITY, Anhui (CN)

( * ) Notice: Subject to any disclaimer, the term of this patent is extended or adjusted under 35 U.S.C. 154(b) by 0 days.

(21) Appl. No.: 17/441,676

(22) PCT Filed: Dec. 25, 2020

(86) PCT No.: PCT/CN2020/139315
§ 371 (c)(1),
(2) Date: Sep. 21, 2021

(87) PCT Pub. No.: WO2022/021772
PCT Pub. Date: Feb. 3, 2022

(30) Foreign Application Priority Data

Jul. 27, 2020 (CN) .......................... 202010733096.8

(51) Int. Cl.
*G11C 7/02* (2006.01)
*G11C 7/08* (2006.01)
*H03K 19/20* (2006.01)

(52) U.S. Cl.
CPC ................ *G11C 7/08* (2013.01); *H03K 19/20* (2013.01)

(58) Field of Classification Search
CPC .................................. G11C 7/08; H03K 19/20
(Continued)

(56) References Cited

U.S. PATENT DOCUMENTS

| 5,226,014 A | 7/1993 | McManus | |
|---|---|---|---|
| 2011/0080796 A1* | 4/2011 | Bruennert | G11C 11/4091 365/205 |

FOREIGN PATENT DOCUMENTS

| CN | 102543146 A | 7/2012 |
|---|---|---|
| CN | 111145799 A | 5/2020 |
| CN | 111863049 A | 10/2020 |

OTHER PUBLICATIONS

International Search Report and English Translation cited in PCT/CN2020/139315 dated Apr. 26, 2021, 19 pages.
(Continued)

*Primary Examiner* — Huan Hoang
(74) *Attorney, Agent, or Firm* — Cooper Legal Group, LLC

(57) ABSTRACT

The present disclosure provides a sense amplifier, a memory, and a method for controlling a sense amplifier, relating to the technical field of semiconductor memories. The sense amplifier comprises: an amplification module, configured to read data in a storage unit on a bit line or a storage unit on a reference bit line; and a first switch module, configured to control the amplification module to be disconnected from the reference bit line when the sense amplifier reads a first state for the bit line and the sense amplifier is in an amplification stage, and control the amplification module to be connected to the reference bit line when the sense amplifier reads a second state for the bit line and the sense
(Continued)

amplifier is in the amplification stage. The present disclosure can reduce the power consumption of the sense amplifier.

18 Claims, 7 Drawing Sheets

(58) Field of Classification Search
USPC .......................................................... 365/207
See application file for complete search history.

(56) References Cited

OTHER PUBLICATIONS

Li, et al., "Research and Design of Tolerance Deviation Sensitive Amplifier", Computerand Digital Engineering, vol. 47, No. 11, 2019, 2667-2670.

* cited by examiner

SENSE AMPLIFIER, MEMORY AND METHOD FOR CONTROLLING SENSE AMPLIFIER

CROSS-REFERENCE TO RELATED APPLICATIONS

The present application claims the priority to the Chinese patent application 202010733096.8, titled "SENSE AMPLIFIER, MEMORY AND METHOD FOR CONTROLLING THE SENSE AMPLIFIER", filed on Jul. 27, 2020, which is incorporated herein by reference in its entirety.

TECHNICAL FIELD

The present disclosure relates to the technical field of semiconductor memories, and in particular to a sense amplifier, a memory, and a method for controlling a sense amplifier.

BACKGROUND OF THE PRESENT INVENTION

With the popularization of electronic devices such as mobile phones, tablets, and personal computers, the semiconductor memory technology developed rapidly. For example, memories, such as DRAMs (Dynamic Random Access Memories) and SRAMs (Static Random-Access Memories), have been widely used in various electronic devices due to their advantages of high density, low power consumption, low price, etc.

As an important part of a semiconductor memory, a sense amplifier (SA for short) mainly functions to amplify small signals on a bit line to perform read or write operations.

As an important indicator of the performance of sense amplifiers, power consumption directly affects the application scenarios of the memories. At present, how to reduce the power consumption of the sense amplifiers has become an urgent problem to be solved.

It should be noted that the information disclosed in the background section is only provided to enhance the understanding of the background of the present disclosure, and therefore may include information that does not constitute the existing technologies known to a person of ordinary skill in the art.

SUMMARY OF THE PRESENT INVENTION

The purpose of the present disclosure is to provide a sense amplifier, a memory, and a method for controlling a sense amplifier, so as to at least to some extent overcome the problem of high power consumption of the sense amplifier due to the limitations and defects of related technologies.

According to a first aspect of the present disclosure, a sense amplifier is provided, comprising: an amplification module, configured to read data in a storage unit on a bit line or a storage unit on a reference bit line; and a first switch module, configured to control the amplification module to be disconnected from the reference bit line when the sense amplifier reads a first state for the bit line and the sense amplifier is in an amplification stage, and control the amplification module to be connected to the reference bit line when the sense amplifier reads a second state for the bit line and the sense amplifier is in the amplification stage.

Optionally, the first switch module is configured to control, when the sense amplifier is in the amplification stage, a connection state between the amplification module and the reference bit line based on a voltage transmitted by the bit line and a data source control signal; wherein, the connection state between the amplification module and the reference bit line comprises the disconnection of the amplification module from the reference bit line and the connection of the amplification module to the reference bit line.

Optionally, the first switch module comprises: a first NOR gate, a first input terminal of the first NOR gate is connected to the amplification module through a first node, and a second input terminal of the first NOR gate is configured to receive the data source control signal; and a first switch unit, a first control terminal of the first switch unit being connected to an output terminal of the first NOR gate, a first terminal of the first switch unit being connected to the amplification module through a second node, and a second terminal of the first switch unit being connected to the reference bit line.

Optionally, the first switch module further comprises: a second switch unit, a control terminal of the second switch unit being connected to the first node, a first terminal of the second switch unit being connected to the output terminal of the first NOR gate, and a second terminal of the second switch unit being connected to the reference bit line.

Optionally, the first switch module controls the connection state between the amplification module and the reference bit line based on the voltage transmitted by the bit line and the data source control signal, comprising: the first switch module is configured to control the connection state between the amplification module and the reference bit line, in response to the voltage transmitted by the bit line, the data source control signal and a first control signal; wherein, the first switch unit further comprises a second control terminal configured to receive the first control signal.

Optionally, the amplification module comprises: a first PMOS transistor, a drain of the first PMOS transistor being connected to a first node; a first NMOS transistor, a drain of the first NMOS transistor being connected to the first node, and a gate of the first NMOS transistor being connected to a gate of the first PMOS transistor; a second PMOS transistor, a drain of the second PMOS transistor being connected to a second node; a second NMOS transistor, a drain of the second NMOS transistor being connected to the second node, and a gate of the second NMOS transistor being connected to a gate of the second PMOS transistor; a third PMOS transistor, a drain of the third PMOS transistor being connected to a source of the first PMOS transistor and a source of the second PMOS transistor, a gate of the third PMOS transistor being configured to receive a first control signal, and a source of the third PMOS transistor being configured to receive a power supply voltage; and a third NMOS transistor, a drain of the third NMOS transistor being connected to a source of the first NMOS transistor and a source of the second NMOS transistor, a gate of the third NMOS transistor being configured to receive a second control signal, and a source of the third NMOS transistor being grounded; wherein, a gate of the first PMOS transistor is connected to the second node, and a gate of the second PMOS transistor is connected to the first node.

Optionally, the first switch unit comprises: a fourth PMOS transistor, a gate of the fourth PMOS transistor being connected to an output terminal of the first NOR gate, a drain of the fourth PMOS transistor being connected to the second node, and a source of the fourth PMOS transistor being connected to the reference bit line.

Optionally, the first switch unit comprises: a fourth PMOS transistor, a gate of the fourth PMOS transistor being connected to an output terminal of the first NOR gate, a drain of the fourth PMOS transistor being connected to the second node, and a source of the fourth PMOS transistor being connected to the reference bit line; and a fourth NMOS transistor, a gate of the fourth NMOS transistor being configured to receive the first control signal, a source of the fourth NMOS transistor being connected to the second node, and a drain of the fourth NMOS transistor being connected to the reference bit line.

Optionally, the sense amplifier further comprises: a second switch module, configured to control the amplification module to be disconnected from the bit line when the sense amplifier reads a first state for the reference bit line and the sense amplifier is in the amplification stage, and control the amplification module to be connected to the bit line when the sense amplifier reads a second state for the reference bit line and the sense amplifier is in the amplification stage.

Optionally, the second switch module comprises: an inverter, an input terminal of the inverter being configured to receive a data source control signal; a second NOR gate, a first input terminal of the second NOR gate being connected to an output terminal of the inverter, and a second input terminal of the second NOR gate being connected to the amplification module through a second node; and a third switch unit, a first control terminal of the third switch unit being connected to an output terminal of the second NOR gate, a first terminal of the third switch unit being connected to the amplification module through a first node, and a second terminal of the third switch unit being connected to the bit line.

Optionally, the second switch module further comprises: a fourth switch unit, a control terminal of the fourth switch unit being connected to the second node, a first terminal of the fourth switch unit being connected to an output terminal of the second NOR gate, and a second terminal of the fourth switch unit being connected to the bit line.

Optionally, the third switch unit further comprises: a second control terminal, configured to receive a first control signal.

Optionally, the third switch unit comprises: a fifth PMOS transistor, a gate of the fifth PMOS transistor being connected to an output terminal of the second NOR gate, a drain of the fifth PMOS transistor being connected to the first node, and a source of the fifth PMOS transistor being connected to the bit line.

Optionally, the third switch unit comprises: a fifth PMOS transistor, a gate of the fifth PMOS transistor being connected to an output terminal of the second NOR gate, a drain of the fifth PMOS transistor being connected to the first node, and a source of the fifth PMOS transistor being connected to the bit line; and a fifth NMOS transistor, a gate of the fifth NMOS transistor being configured to receive the first control signal, a source of the fifth NMOS transistor being connected to the first node, and a drain of the fifth NMOS transistor being connected to the bit line.

Optionally, the sense amplifier further comprises: a pre-charge module, configured to pre-charge the bit line and the reference bit line when the sense amplifier is in a pre-charge stage.

Optionally, reading the first state is reading 0, and reading the second state is reading 1.

According to a second aspect of the present disclosure, a memory is provided, comprising the sense amplifier described above.

According to a third aspect of the present disclosure, a method for controlling a sense amplifier is provided, comprising: controlling the sense amplifier to be disconnected from a reference bit line when the sense amplifier reads a first state for a bit line and the sense amplifier is in an amplification stage; and controlling the sense amplifier to be connected to the reference bit line when the sense amplifier reads a second state for the bit line and the sense amplifier is in the amplification stage.

In the technical solutions provided in some embodiments of the present disclosure, the first switch module is configured to control the amplification module to be disconnected from the reference bit line when the sense amplifier reads the first state for the bit line and the sense amplifier is in the amplification stage. Since the amplification module is disconnected from the reference bit line, the sense amplifier will not amplify the voltage on the reference bit line in the amplification stage. Therefore, when the first state is read for the bit line, the power consumption of the sense amplifier will be greatly reduced. In addition, since, in the solution of the present disclosure, the voltage on the reference bit line is not amplified when the first state is read for the bit line, the signal processing speed of the circuit is improved.

It should be understood that the aforementioned general description and the following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort. In the drawings.

DETAILED DESCRIPTION OF THE PRESENT INVENTION

Figure 1:
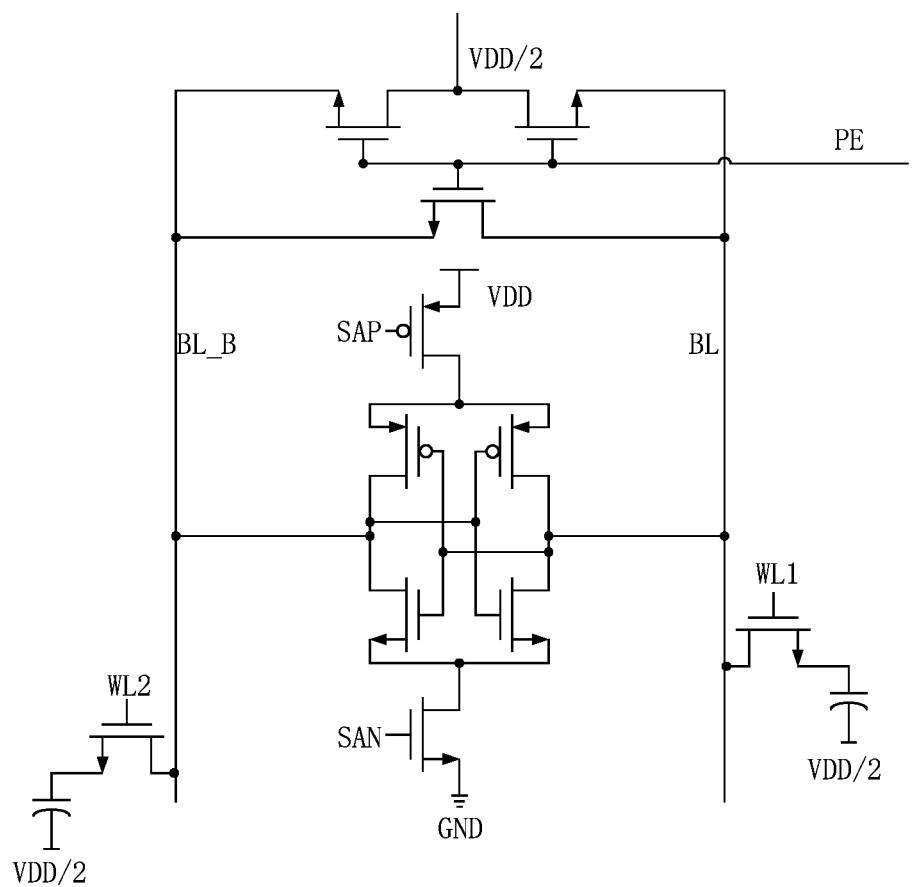
FIG. 1 schematically shows a schematic diagram of a sense amplifier according to an embodiment of the present disclosure.

Exemplary implementations will now be described more fully with reference to the accompanying drawings. However, the exemplary implementations may be implemented in various forms, and should not be construed as being limited to the examples set forth herein; instead, these implementations are provided to make the present disclosure more comprehensive and complete, and to fully convey the concepts of the exemplary implementations to those skilled in the art. The described features, structures or characteristics may be combined in one or more implementations in any suitable way. In the following description, many specific details are provided to give a sufficient understanding of the implementations of the present disclosure. However, it will be realized by those skilled in the art that the technical solutions of the present disclosure may be practiced without one or more of the specific details, or other methods, components, apparatuses, steps, etc. may be used. In other cases, the well-known technical solutions will not be shown or described in detail in order to avoid obscuring the aspects of the present disclosure.

In addition, the drawings are merely schematic illustrations of the present disclosure, and are not necessarily drawn to scale. The same reference numerals in the figures denote the same or similar parts, and thus the repeated description thereof will be omitted. Terms "first", "second", "third", "fourth" and "fifth" are merely used for distinction and should not be considered as any limitation to the present disclosure.

It should be noted that the term "connection", as used herein, may include direct connection and indirect connection. In direct connection, there are no components between terminals. For example, the connection of the first terminal of a switch A to the first terminal of a switch B may mean that there is only a connecting wire (e.g., metal wire) between the first terminal of the switch A and the first terminal of the switch B, without any other components. In indirect connection, there may be other components between the terminals. For example, the connection of the first terminal of a switch C to the first terminal of a switch D may mean that there is at least one other component (for example, a switch E, etc.) on the connection line between the first terminal of the switch C and the first terminal of the switch D, in addition to the connecting wire.

FIG. 1 schematically shows a schematic diagram of a sense amplifier according to an embodiment of the present disclosure.

Referring to FIG. 1, in the process of reading data in a storage unit on a bit line, first, a bit line BL and a reference bit line BL_B may be pre-charged to VDD/2. Next, after address decoding, a corresponding word line WL is turned on. For example, when the least significant bit A0 of the row address is at a low level, it indicates an even address; and when the least significant bit A0 of the row address is at a high level, it indicates an odd address. It may be specified that, after address decoding, what is turned on by an even address is a storage unit connected to the bit line BL, and what is turned on by an odd address is a storage unit connected to the reference bit line BL_B. Then, charge-sharing is performed between the storage voltage and the bit line, and a voltage difference between the bit line BL and the reference bit line BL_B is generated. Then, in the amplification stage, regardless of reading 0 or reading 1, the power supply VDD will work to pull the bit line voltage on a side to VDD and the bit line voltage on the other side down to zero by GND. It should be noted that the determination of an even address or an odd address is not limited to the identification by the least significant bit A0 of the row address, and instead, it may be identified by the other bits of the row address, and it may also be identified by the result of specific processing of at least one bit of the row address, which will not be limited in the present disclosure and may be set by those skilled in the art as required.

When reading 0 for the bit line BL, since an operation of writing back to the storage unit is not performed for the reference bit line BL_B, the voltage of the reference bit line BL_B does not need to be amplified to VDD, that is, the amplified potential of the reference bit line BL_B will not affect the reading of data. Therefore, the connection of the sense amplifier to the reference bit line BL_B may be cut off in the amplification stage, to reduce the power consumption when 0 is read for the bit line BL.

In view of this, the present disclosure further provides a novel sense amplifier.

Figure 2:
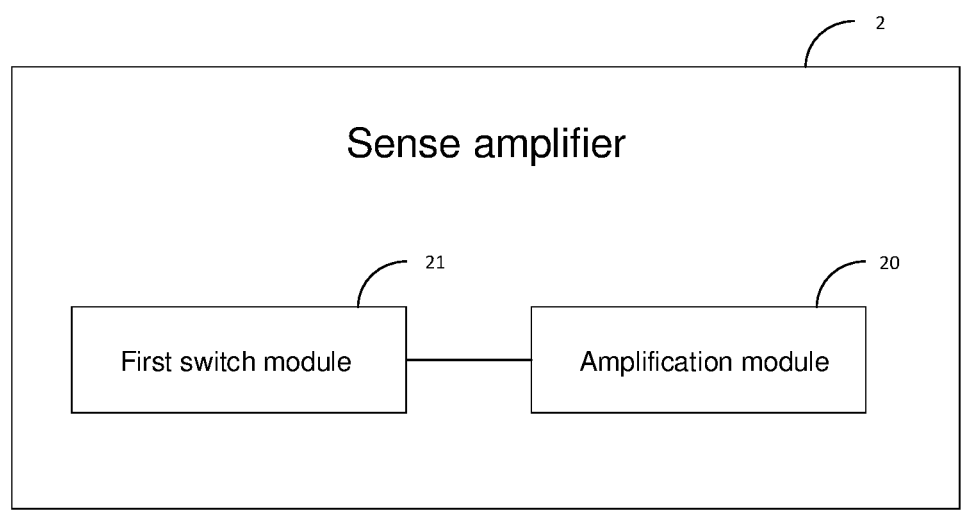
FIG. 2 schematically shows a block diagram of a sense amplifier according to an exemplary implementation of the present disclosure.

FIG. 2 schematically shows a block diagram of a sense amplifier according to an exemplary implementation of the present disclosure. Referring to FIG. 2, the sense amplifier 2 may include an amplification module 20 and a first switch module 21.

The amplification module 20 may be configured to read data in a storage unit on a bit line or a reference bit line; and the first switch module 21 may be configured to control the amplification module 20 to be disconnected from the reference bit line when the sense amplifier 2 reads a first state for the bit line and the sense amplifier 2 is in an amplification stage, and control the amplification module 20 to be connected to the reference bit line when the sense amplifier 2 reads a second state for the bit line and the sense amplifier 2 is in the amplification stage.

It should be understood that, in the present disclosure, the reading the first state generally refers to reading 0, and the reading the second state generally refers to reading 1. However, the first state and the second state may be interchanged as needed, and may be other types of storage states, which will not be limited in the present disclosure.

By controlling the amplification module to be disconnected from the reference bit line when the sense amplifier reads the first state for the bit line and the sense amplifier is in the amplification stage, the power consumption of the sense amplifier can be effectively reduced and the processing speed of the circuit can be improved.

Specifically, when the sense amplifier 2 is in the amplification stage, the first switch module 21 can control the connection state between the amplification module 20 and the reference bit line based on the voltage transmitted by the bit line and the data source control signal. It is easy to understand that the connection state mentioned here generally refers to two situations: the disconnection of the amplification module 20 from the reference bit line and the connection of the amplification module 20 to the reference bit line.

The data source control signal indicates the data read is from a storage unit on a bit line or a storage unit on a reference bit line. Generally, the least significant bit A0 of the row address may be used as the data source control signal. For example, when the least significant bit A0 of the row address is at a low level, it indicates an even address, and a storage unit on the bit line is turned on correspondingly; and when the least significant bit A0 of the row address is at a high level, it indicates an odd address, and a storage unit on the reference bit line is turned on correspondingly. However, it should be noted that the data source control signal in the present disclosure may be any signal that can identify whether to read data in a storage unit on a bit line or data in a storage unit on a reference bit line, which is not limited in the present disclosure.

The first switch module 21 may comprise a first NOR gate and a first switch unit.

Specifically, a first input terminal of the first NOR gate is connected to the amplification module 20 through a first node, and is configured to receive the voltage of a bit line when the sense amplifier 2 is in the amplification stage. A second input terminal of the first NOR gate is configured to receive the aforementioned data source control signal.

A first control terminal of the first switch unit may be connected to an output terminal of the first NOR gate, a first terminal of the first switch unit may be connected to the amplification module 20 through a second node, and a second terminal of the first switch unit may be connected to a reference bit line. It should be understood that the first switch unit may be configured to control the connection state between the amplification module 20 and the reference bit line, and the connection state comprises disconnection and connection.

In addition, the first switch module 21 may further comprise a second switch unit.

A control terminal of the second switch unit is connected to the first node, a first terminal of the second switch unit is connected to the output terminal of the first NOR gate, and a second terminal of the second switch unit is connected to the reference bit line.

According to some embodiments of the present disclosure, in addition to the first control terminal, the first switch unit may comprise a second control terminal configured to receive a first control signal. In this case, the first switch module 21 may be configured to control the connection state between the amplification module 20 and the reference bit line, in response to the voltage transmitted by the bit line, the data source control signal and the first control signal.

In an exemplary implementation of the present disclosure, the amplification module 20 may comprise a first PMOS transistor, a first NMOS transistor, a second PMOS transistor, a second NMOS transistor, a third PMOS transistor, and a third NMOS transistor.

Specifically, a drain of the first PMOS transistor is connected to the first node, and a gate of the first PMOS transistor is connected to the second node; a drain of the first NMOS transistor is connected to the first node, and a gate of the first NMOS transistor is connected to a gate of the first PMOS transistor; a drain of the second PMOS transistor is connected to the second node, and a gate of the second PMOS transistor is connected to the first node; a drain of the second NMOS transistor is connected to the second node, and a gate of the second NMOS transistor is connected to a gate of the second PMOS transistor; a drain of the third PMOS transistor is connected to a source of the first PMOS transistor and a source of the second PMOS transistor, a gate of the third PMOS transistor is configured to receive the first control signal, and a source of the third PMOS transistor is configured to receive a power supply voltage; a drain of the third NMOS transistor is connected to a source of the first NMOS transistor and a source of the second NMOS transistor, a gate of the third NMOS transistor is configured to receive a second control signal, and a source of the third NMOS transistor is grounded.

According to an embodiment of the present disclosure, the first switch unit may comprise a fourth PMOS transistor. A gate of the fourth PMOS transistor is connected to an output terminal of the first NOR gate, a drain of the fourth PMOS transistor is connected to the second node, and a source of the fourth PMOS transistor is connected to the reference bit line.

According to another embodiment of the present disclosure, in addition to the fourth PMOS transistor, the first switch unit may comprise a fourth NMOS transistor. A gate of the fourth NMOS transistor is configured to receive the first control signal, a source of the fourth NMOS transistor is connected to the second node, and a drain of the fourth NMOS transistor is connected to the reference bit line.

Figure 3:
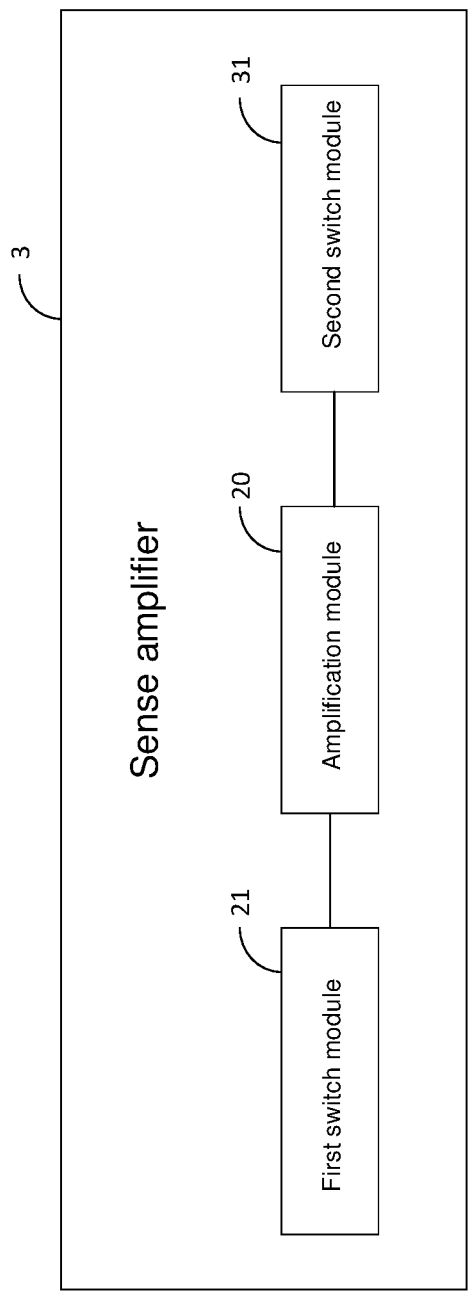
FIG. 3 schematically shows a block diagram of a sense amplifier according to another exemplary implementation of the present disclosure.

Referring to FIG. 3, in addition to the first switch module 21 and the amplification module 20 described above, the sense amplifier 3 may comprise a second switch module 31. The second switch module 31 may be configured to: control the amplification module 20 to be disconnected from the bit line when the sense amplifier 3 reads a first state for the reference bit line and the sense amplifier 3 is in an amplification stage, and control the amplification module 20 to be connected to the bit line when the sense amplifier 3 reads a second state for the bit line and the sense amplifier 3 is in the amplification stage.

That is, similar to the first switch module 21, the connection state between the amplification module 20 and the bit line may be controlled through the second switch module 31.

The second switch module is configured to control the amplification module to be disconnected from the bit line when the sense amplifier reads the first state for the reference bit line and the sense amplifier is in the amplification stage. Since the amplification module is disconnected from the bit line, the sense amplifier will not amplify the voltage of the bit line in the amplification stage. Therefore, when the first state is read for the reference bit line, the power consumption of the sense amplifier will be greatly reduced. In addition, since the voltage of the bit line is not amplified when the first state is read for the reference bit line, the signal processing speed of the circuit is improved.

In addition, in a case where the first switch module 21 controls the connection state between the amplification module and the reference bit line, the second switch module 31 may be further configured to write the read signal back to the storage unit after the sense amplifier 3 performs a read operation for the bit line.

The second switch module 31 may comprise an inverter, a second NOR gate, and a third switch unit.

An input terminal of the inverter is configured to receive the data source control signal. A first input terminal of the second NOR gate is connected to an output terminal of the inverter, and a second input terminal of the second NOR gate is connected to the amplification module through the second node. A first control terminal of the third switch unit is connected to an output terminal of the second NOR gate, a first terminal of the third switch unit is connected to the amplification module 20 through the first node, and a second terminal of the third switch unit is connected to the bit line.

In some embodiments, the third switch unit further comprises: a second control terminal, configured to receive the first control signal.

In addition, the second switch module 31 may further comprise a fourth switch unit.

A control terminal of the fourth switch unit is connected to the second node, a first terminal of the fourth switch unit is connected to an output terminal of the second NOR gate, and a second terminal of the fourth switch unit is connected to the bit line.

According to an embodiment of the present disclosure, the third switch unit may comprise a fifth PMOS transistor. A gate of the fifth PMOS transistor is connected to the output terminal of the second NOR gate, a drain of the fifth PMOS transistor is connected to the first node, and a source of the fifth PMOS transistor is connected to the bit line.

According to another embodiment of the present disclosure, in addition to the fifth PMOS transistor, the third switch unit may comprise a fifth NMOS transistor. A gate of the fifth NMOS transistor is configured to receive the first control signal, a source of the fifth NMOS transistor is connected to the first node, and a drain of the fifth NMOS transistor is connected to the bit line.

In addition, the sense amplifier 3 may comprise an isolation unit. A first terminal of the isolation unit is connected to the second NOR gate, a second terminal of the isolation unit is grounded, and a control terminal of the isolation unit is configured to receive the second control signal. Specifically, as a switch unit, the isolation unit may be configured as an NMOS transistor, for example.

It may be understood that the aforementioned sense amplifiers of various configurations may comprise a pre-charge module. The pre-charge module is configured to pre-charge the bit line and the reference bit line when the sense amplifier is in the pre-charge stage.

Figure 4:
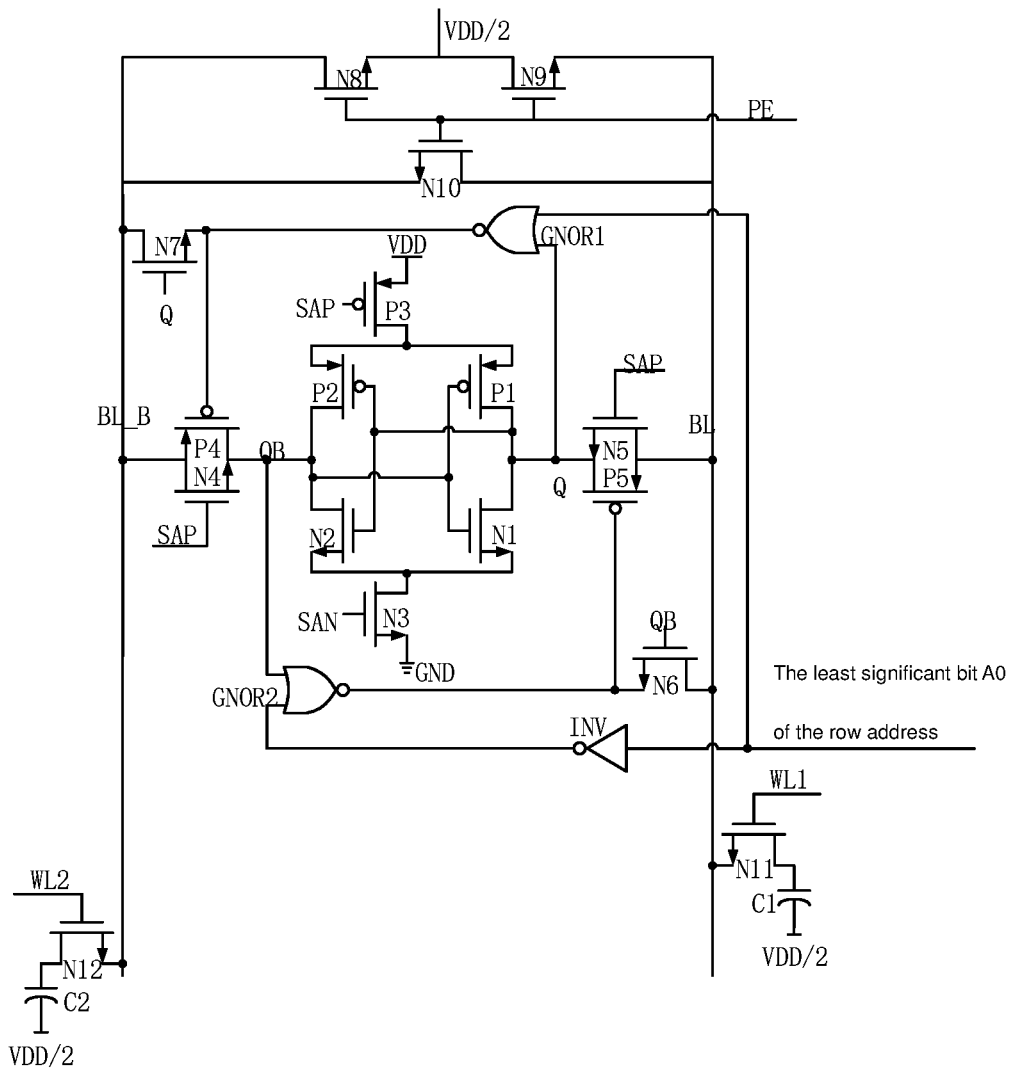
FIG. 4 schematically shows a circuit diagram of a sense amplifier according to an exemplary implementation of the present disclosure.

FIG. 4 schematically shows a circuit diagram of a sense amplifier according to an exemplary implementation of the present disclosure.

In the embodiment shown in FIG. 4, the bit line is denoted by BL, the reference bit line is denoted by BL_B, the first node is denoted by Q, and the second node is denoted by QB.

The first PMOS transistor is denoted by P1, the first NMOS transistor is denoted by N1, the second PMOS transistor is denoted by P2, the second NMOS transistor is denoted by N2, the third PMOS transistor is denoted by P3, the third NMOS transistor is denoted by N3, the fourth PMOS transistor is denoted by P4, the fourth NMOS transistor is denoted by N4, the fifth PMOS transistor is denoted by P5, the fifth NMOS transistor is denoted by N5, the first NOR gate is denoted by GNOR1, the second NOR gate is denoted by GNOR2, and the inverter is denoted by INV. In addition, the first control signal is denoted by signal SAP, and the second control signal is denoted by signal SAN.

The second switch unit is configured as an NMOS transistor N7, and the fourth switch unit is configured as an NMOS transistor N6.

The pre-charge module is configured to comprise NMOS transistors N8, N9 and N10, and the pre-charge control is performed by the pre-charge control signal PE.

In addition, the storage unit on the bit line BL may comprise an NMOS transistor N11 and a capacitor C1. By the control of the word line WL1, the reading and writing of data in the capacitor C1 may be realized. The storage unit on the reference bit line BL_B may comprise an NMOS transistor N12 and a capacitor C2. By the control of the word line WL2, the reading and writing of data in the capacitor C2 may be realized.

In the example shown in FIG. 4, the least significant bit A0 of the row address is used as the data source control signal.

It should be understood that the configuration of the components in the circuit shown in FIG. 4 is only exemplary, and the involved elements with a switching function may be configured as NMOS transistors, PMOS transistors or transmission gates, which will not be limited in the present disclosure.

Figure 5:
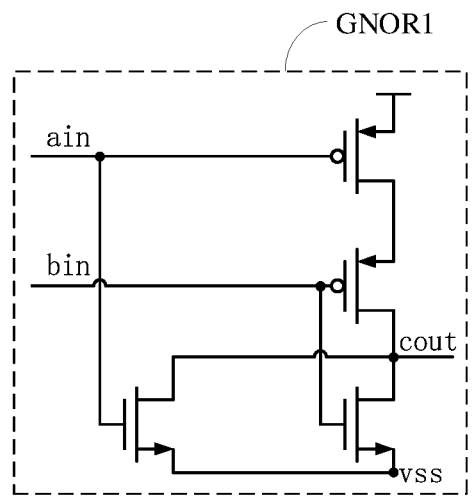
FIG. 5 schematically shows a circuit diagram of a first NOR gate and/or a second NOR gate according to an exemplary implementation of the present disclosure.

FIG. 5 schematically shows a circuit diagram of a NOR gate, which may be configured to implement the first NOR gate GNOR1 and/or the second NOR gate GNOR2 in the present disclosure. Referring to FIG. 5, the NOR gate may be configured as a circuit structure comprising two PMOS transistors and two NMOS transistors, ain and bin represent two inputs of the first NOR gate GNOR1, and cout represents an output of the first NOR gate GNOR1.

Figure 6:
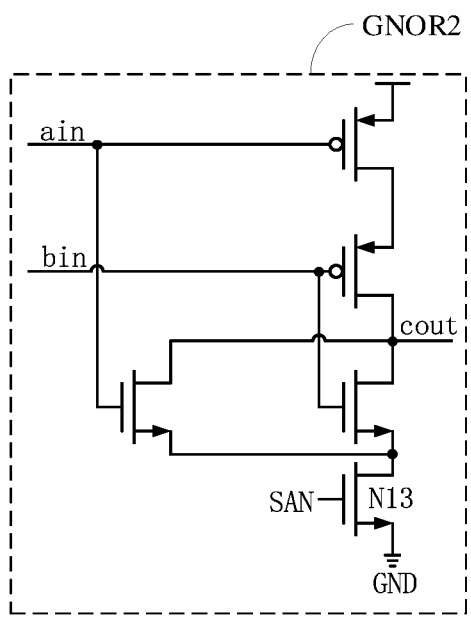
FIG. 6 schematically shows a circuit diagram of a first NOR gate and/or a second NOR gate according to another exemplary implementation of the present disclosure.

FIG. 6 schematically shows a circuit diagram of another NOR gate, which may be configured to implement the first NOR gate GNOR1 and/or the second NOR gate GNOR2 in the present disclosure. Referring to FIG. 6, the NOR gate may be configured as a circuit structure comprising two PMOS transistors and two NMOS transistors, ain and bin represent two inputs of the second NOR gate GNOR2, and cout represents an output of the second NOR gate GNOR2.

Different from the NOR gate shown in FIG. 5, the NOR gate shown in FIG. 6 may comprise an isolation unit. The isolation unit may be configured, for example, as an NMOS transistor N13, to control the on-off state of the isolation unit based on the second control signal SAN.

The operation of reading the bit line by the sense amplifier may comprise a pre-charge stage, a sensing stage, and an amplification stage.

Figure 7:
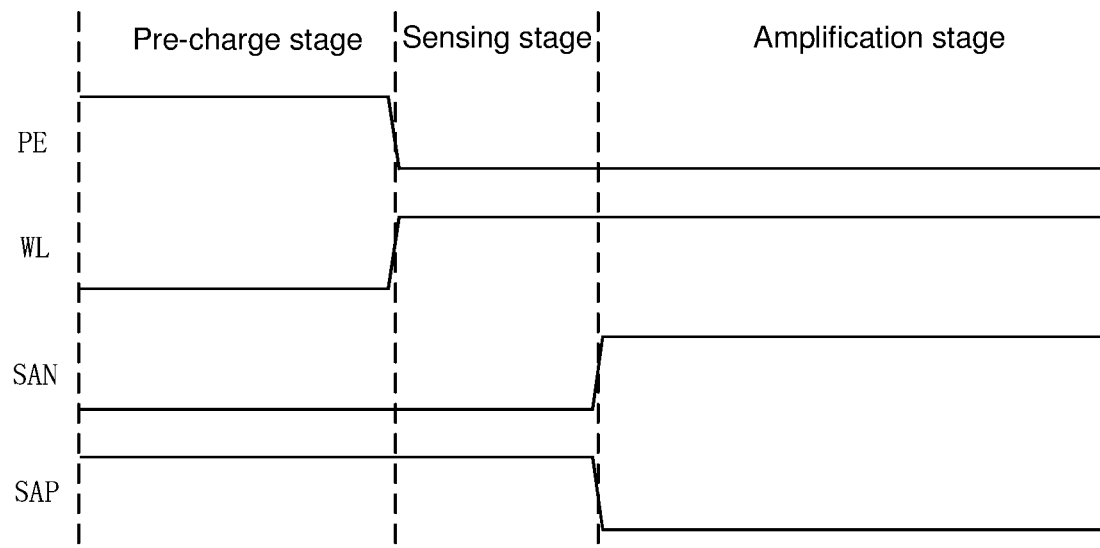
FIG. 7 schematically shows a timing diagram of a sense amplifier according to an exemplary implementation of the present disclosure.

Hereinafter, taking the operation of turning on the storage unit on the bit line BL when the least significant bit A0 of the row address is at a low level as an example, the working process of the sense amplifier according to the exemplary implementation of the present disclosure shown in FIG. 4 will be described in combination with the timing diagram of FIG. 7.

Read the First State:

In the pre-charge stage, the first control signal SAP is at a high level and the second control signal SAN is at a low level. The transistor P3 and the transistor N3 are turned off, and the transistor N4 and the transistor N5 are turned on. The pre-charge control signal PE is at a high level to pre-charge the bit line BL and the reference bit line BL_B. In this case, the first node Q and the second node QB will be pre-charged to VDD/2.

In the sensing stage, the word line WL is at a high level, the storage unit is turned on, and the voltages of the bit line BL and the reference bit line BL_B are transferred to the first node Q and the second node QB for charge sharing.

In the amplification stage, the first control signal SAP is at a low level and the second control signal SAN is at a high level. The transistor P3 and the transistor N3 are turned on, and the transistor N4 and the transistor N5 are turned off. In this case, the sense amplifier can quickly amplify the voltage of the first node Q to a low level and amplify the voltage of the second node QB to a high level. At this time, the transistor N6 is turned on and the transistor N7 is turned off, and at the same time, the first NOR gate GNOR1 outputs a high level, the second NOR gate GNOR2 outputs a low level, the transistor P4 is turned off, and the transistor P5 is turned on. From this, it may be known that the reference bit line BL_B is disconnected from the sense amplifier, and the operation of writing back to the storage unit on the bit line BL is realized through the transistor P5 and the transistor N6, that is, 0 is written back to the capacitor C1.

Read the Second State:

In the pre-charge stage, the first control signal SAP is at a high level and the second control signal SAN is at a low level. The transistor P3 and the transistor N3 are turned off, and the transistor N4 and the transistor N5 are turned on. The pre-charge control signal PE is at a high level to pre-charge the bit line BL and the reference bit line BL_B. In this case, the first node Q and the second node QB will be pre-charged to VDD/2.

In the sensing stage, the word line WL is at a high level, the storage unit is turned on, and the voltages of the bit line BL and the reference bit line BL_B are transferred to the first node Q and the second node QB for charge sharing.

In the amplification stage, the first control signal SAP is at a low level and the second control signal SAN is at a high level. The transistor P3 and the transistor N3 are turned on, and the transistor N4 and the transistor N5 are turned off. In this case, the sense amplifier can quickly amplify the voltage of the first node Q to a high level and amplify the voltage of the second node QB to a low level. At this time, the transistor N6 is turned off and the transistor N7 is turned on, and at the same time, the first NOR gate GNOR1 outputs a low level, the second NOR gate GNOR2 outputs a low level, the transistor P4 is turned on, and the transistor P5 is turned on. From this, it may be known that the reference bit line BL_B is connected to the sense amplifier, and the operation of writing back to the storage unit on the bit line BL is realized through the transistor P5, that is, 1 is written back to the capacitor C1.

Although the above description takes the operation of turning on the storage unit on the bit line BL when the least significant bit A0 of the row address is at a low level as an example, those skilled in the art can think of other modes included in the present disclosure based on the exemplary solution of the present disclosure.

Figure 8:
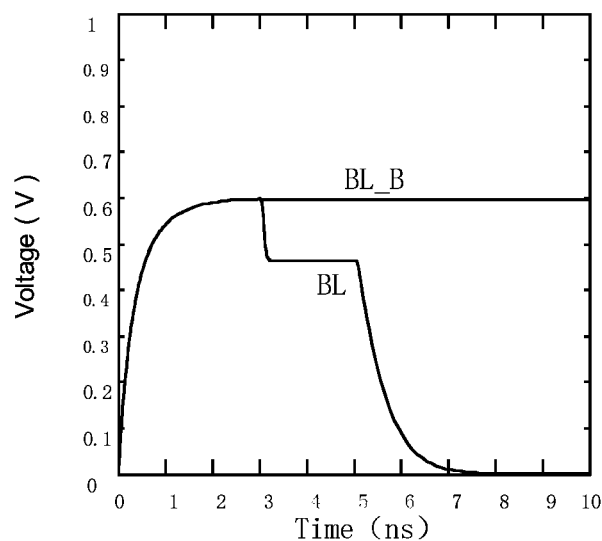
FIG. 8 shows a schematic diagram of voltages of a bit line and a reference bit line when the sense amplifier reads a first state for the bit line, according to an exemplary implementation of the present disclosure.

FIG. 8 shows a schematic diagram of voltages of a bit line and a reference bit line when the sense amplifier reads a first state for the bit line, according to an exemplary implementation of the present disclosure.

Referring to FIG. 8, when the sense amplifier reads the first state for the bit line BL, the reference bit line BL_B does not participate in the amplification and always maintains the voltage VDD/2 when it is pre-charged, and the power supply will not consume power since the power supply will not charge the reference bit line BL_B.

Figure 9:
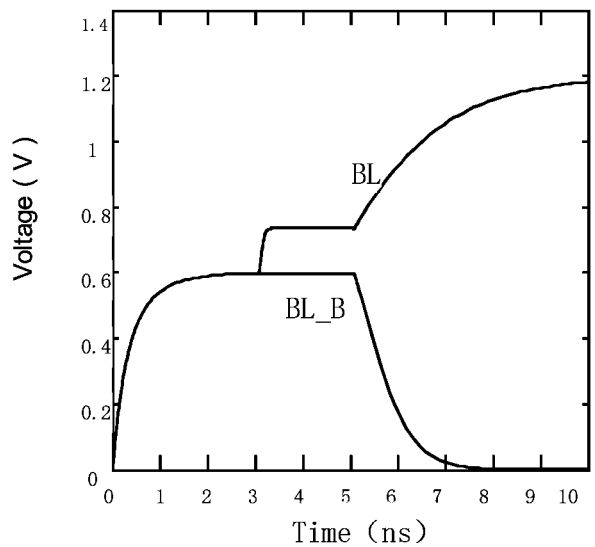
FIG. 9 shows a schematic diagram of voltages of a bit line and a reference bit line when the sense amplifier reads a second state for the bit line, according to an exemplary implementation of the present disclosure.

FIG. 9 shows a schematic diagram of voltages of a bit line and a reference bit line when the sense amplifier reads a second state for the bit line, according to an exemplary implementation of the present disclosure.

Referring to FIG. 9, when the sense amplifier reads the second state for the bit line BL, the reference bit line BL_B remains connected to the sense amplifier, and discharges to the ground in the amplification stage, so as to be pre-charged with balance to VDD/2 in the next cycle. This does not affect continuous operation.

Table 1 shows the comparison between the power consumption of the sense amplifier shown in FIG. 1 and the power consumption of the sense amplifier shown in FIG. 4. It may be known that the power consumption can be effectively reduced by using the sense amplifier according to the exemplary implementation of the present disclosure.

TABLE 1

| Circuit compared | Read mode | Power consumption for pre-charging (fJ) | Power consumption for amplification (fJ) | Power consumption for pre-charging with balance in the next cycle (fJ) |
|---|---|---|---|---|
| Circuit shown in FIG. 1 | Read the second state | 72 | 74.904 | 19.686 |
|  | Read the first state | 72 | 76.968 | 19.926 |
| Circuit shown in FIG. 4 | Read the second state | 72 | 74.592 | 19.704 |
|  | Read the first state | 72 | 3.648 | 36.372 |

It should be understood that, in the above description, the sense amplifier according to the exemplary implementation of the present disclosure has been described, by taking, as an example, the case where the sense amplifier controls the amplification module to be disconnected from the reference bit line when the first state is read for the bit line and the sense amplifier is in the amplification stage. However, as mentioned above, the sense amplifier according to the exemplary implementation of the present disclosure can control the amplification module to be disconnected from the bit line when the first state is read for the reference bit line and the sense amplifier is in the amplification stage. As a result, the power consumption of the sense amplifier is greatly reduced, and the signal processing speed of the circuit is improved.

Further, the present disclosure provides a method for controlling a sense amplifier.

Figure 10:
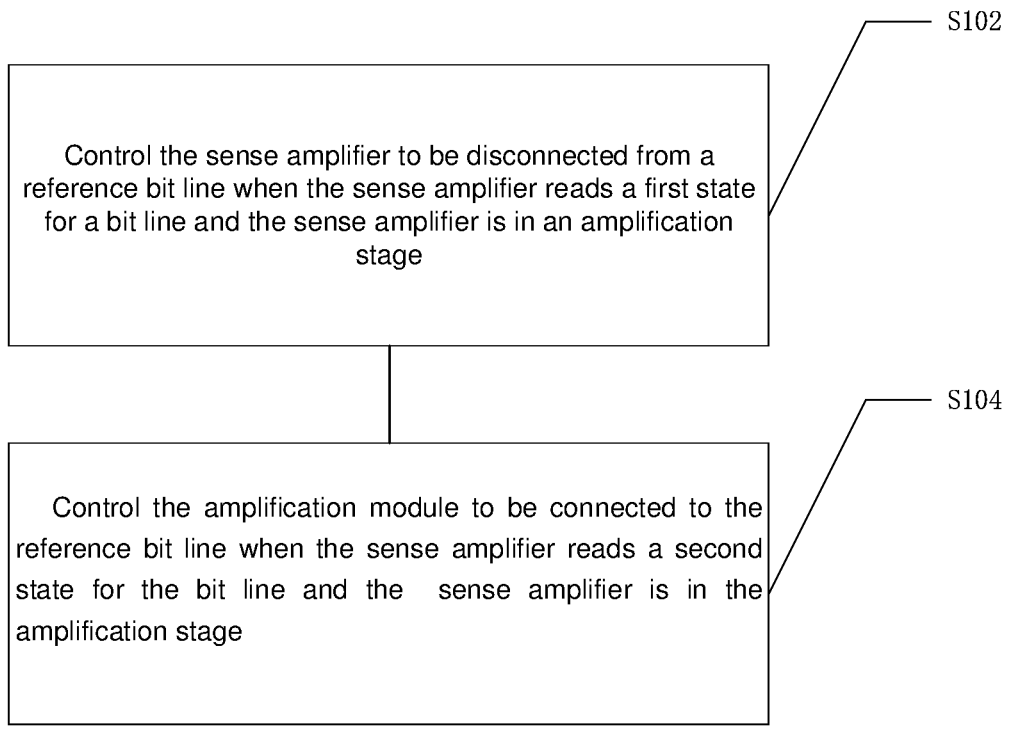
FIG. 10 schematically shows a flowchart of a method for controlling a sense amplifier according to an exemplary implementation of the present disclosure.

FIG. 10 schematically shows a flowchart of a method for controlling the sense amplifier according to an exemplary implementation of the present disclosure.

Referring to FIG. 10, the method for controlling the sense amplifier may comprise the following steps:

S102: controlling the sense amplifier to be disconnected from a reference bit line when the sense amplifier reads a first state for a bit line and the sense amplifier is in an amplification stage; and S104: controlling the amplification module to be connected to the reference bit line when the sense amplifier reads a second state for the bit line and the sense amplifier is in the amplification stage.

In addition, the method for controlling the sense amplifier may further comprise: controlling the sense amplifier to be disconnected from the bit line when the sense amplifier reads a first state for the reference bit line and the sense amplifier is in an amplification stage, and control the sense amplifier to be connected to the bit line when the sense amplifier reads a second state for the reference bit line and the sense amplifier is in the amplification stage.

The process of implementing the method for controlling the sense amplifier in the present disclosure has been explained in the description with reference to the sense amplifier, and will not be repeated here.

By the method for controlling the sense amplifier in the present disclosure, the power consumption of the sense amplifier can be effectively reduced, and the speed of the circuit can be improved.

Further, the present disclosure further provides a memory, comprising the sense amplifier described above.

Those skilled in the art will readily think of other embodiments of the present disclosure by considering the specification and practicing the disclosure disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the claims.

It should be understood that the present disclosure is not limited to the precise structures that have been described above and shown in the drawings, and various modifications and changes may be made without departing from its scope. The scope of the present disclosure is defined only by the appended claims.

The invention claimed is:

1. A sense amplifier, comprising:
   an amplification module, configured to read data in a storage unit on a bit line or a storage unit on a reference bit line; and
   a first switch module, configured to control the amplification module to be disconnected from the reference bit line when the sense amplifier reads a first state for the bit line and the sense amplifier is in an amplification stage, and control the amplification module to be connected to the reference bit line when the sense amplifier reads a second state for the bit line and the sense amplifier is in the amplification stage.

2. The sense amplifier according to claim 1, wherein the first switch module is configured to control, when the sense amplifier is in the amplification stage, a connection state between the amplification module and the reference bit line based on a voltage transmitted by the bit line and a data source control signal;
   wherein, the connection state between the amplification module and the reference bit line comprises the disconnection of the amplification module from the reference bit line and the connection of the amplification module to the reference bit line.

3. The sense amplifier according to claim 2, wherein the first switch module comprises:
   a first NOR gate, a first input terminal of the first NOR gate is connected to the amplification module through a first node, and a second input terminal of the first NOR gate is configured to receive the data source control signal; and
   a first switch unit, a first control terminal of the first switch unit being connected to an output terminal of the first NOR gate, a first terminal of the first switch unit being connected to the amplification module through a second node, and a second terminal of the first switch unit being connected to the reference bit line.

4. The sense amplifier according to claim 3, wherein the first switch module further comprises:
   a second switch unit, a control terminal of the second switch unit being connected to the first node, a first terminal of the second switch unit being connected to the output terminal of the first NOR gate, and a second terminal of the second switch unit being connected to the reference bit line.

5. The sense amplifier according to claim 3, wherein the first switch module controls the connection state between the amplification module and the reference bit line based on the voltage transmitted by the bit line and the data source control signal, comprising:
   the first switch module is configured to control the connection state between the amplification module and the reference bit line, in response to the voltage transmitted by the bit line, the data source control signal and a first control signal;
   wherein, the first switch unit further comprises a second control terminal configured to receive the first control signal.

6. The sense amplifier according to claim 1, wherein the amplification module comprises:
   a first PMOS transistor, a drain of the first PMOS transistor being connected to a first node;
   a first NMOS transistor, a drain of the first NMOS transistor being connected to the first node, and a gate of the first NMOS transistor being connected to a gate of the first PMOS transistor;
   a second PMOS transistor, a drain of the second PMOS transistor being connected to a second node;
   a second NMOS transistor, a drain of the second NMOS transistor being connected to the second node, and a gate of the second NMOS transistor being connected to a gate of the second PMOS transistor;
   a third PMOS transistor, a drain of the third PMOS transistor being connected to a source of the first PMOS transistor and a source of the second PMOS transistor, a gate of the third PMOS transistor being configured to receive a first control signal, and a source of the third PMOS transistor being configured to receive a power supply voltage; and
   a third NMOS transistor, a drain of the third NMOS transistor being connected to a source of the first NMOS transistor and a source of the second NMOS transistor, a gate of the third NMOS transistor being configured to receive a second control signal, and a source of the third NMOS transistor being grounded;
   wherein, a gate of the first PMOS transistor is connected to the second node, and a gate of the second PMOS transistor is connected to the first node.

7. The sense amplifier according to claim 3, wherein the first switch unit comprises:
   a fourth PMOS transistor, a gate of the fourth PMOS transistor being connected to an output terminal of the first NOR gate, a drain of the fourth PMOS transistor being connected to the second node, and a source of the fourth PMOS transistor being connected to the reference bit line.

8. The sense amplifier according to claim 5, wherein the first switch unit comprises:
   a fourth PMOS transistor, a gate of the fourth PMOS transistor being connected to an output terminal of the first NOR gate, a drain of the fourth PMOS transistor being connected to the second node, and a source of the fourth PMOS transistor being connected to the reference bit line; and
   a fourth NMOS transistor, a gate of the fourth NMOS transistor being configured to receive the first control signal, a source of the fourth NMOS transistor being connected to the second node, and a drain of the fourth NMOS transistor being connected to the reference bit line.

9. The sense amplifier according to claim 1, wherein the sense amplifier further comprises:
   a second switch module, configured to control the amplification module to be disconnected from the bit line when the sense amplifier reads a first state for the reference bit line and the sense amplifier is in the amplification stage, and control the amplification module to be connected to the bit line when the sense amplifier reads a second state for the reference bit line and the sense amplifier is in the amplification stage.

10. The sense amplifier according to claim 9, wherein the second switch module comprises:
an inverter, an input terminal of the inverter being configured to receive a data source control signal;
a second NOR gate, a first input terminal of the second NOR gate being connected to an output terminal of the inverter, and a second input terminal of the second NOR gate being connected to the amplification module through a second node; and
a third switch unit, a first control terminal of the third switch unit being connected to an output terminal of the second NOR gate, a first terminal of the third switch unit being connected to the amplification module through a first node, and a second terminal of the third switch unit being connected to the bit line.

11. The sense amplifier according to claim 10, wherein the second switch module further comprises:
a fourth switch unit, a control terminal of the fourth switch unit being connected to the second node, a first terminal of the fourth switch unit being connected to an output terminal of the second NOR gate, and a second terminal of the fourth switch unit being connected to the bit line.

12. The sense amplifier according to claim 10, wherein the third switch unit further comprises:
a second control terminal, configured to receive a first control signal.

13. The sense amplifier according to claim 10, wherein the third switch unit comprises:
a fifth PMOS transistor, a gate of the fifth PMOS transistor being connected to an output terminal of the second NOR gate, a drain of the fifth PMOS transistor being connected to the first node, and a source of the fifth PMOS transistor being connected to the bit line.

14. The sense amplifier according to claim 12, wherein the third switch unit comprises:
a fifth PMOS transistor, a gate of the fifth PMOS transistor being connected to an output terminal of the second NOR gate, a drain of the fifth PMOS transistor being connected to the first node, and a source of the fifth PMOS transistor being connected to the bit line; and
a fifth NMOS transistor, a gate of the fifth NMOS transistor being configured to receive the first control signal, a source of the fifth NMOS transistor being connected to the first node, and a drain of the fifth NMOS transistor being connected to the bit line.

15. The sense amplifier according to claim 1, wherein the sense amplifier further comprises:
a pre-charge module, configured to pre-charge the bit line and the reference bit line when the sense amplifier is in a pre-charge stage.

16. The sense amplifier according to claim 1, wherein the reading the first state is reading 0, and the reading the second state is reading 1.

17. A memory, comprising the sense amplifier according to claim 1.

18. A method for controlling a sense amplifier, comprising:
controlling the sense amplifier to be disconnected from a reference bit line when the sense amplifier reads a first state for a bit line and the sense amplifier is in an amplification stage; and
controlling the sense amplifier to be connected to the reference bit line when the sense amplifier reads a second state for the bit line and the sense amplifier is in the amplification stage.

* * * * *